United States Patent
Wu et al.

(10) Patent No.: US 6,323,141 B1
(45) Date of Patent: Nov. 27, 2001

(54) METHOD FOR FORMING ANTI-REFLECTIVE COATING LAYER WITH ENHANCED FILM THICKNESS UNIFORMITY

(75) Inventors: Szu-Au Wu, Hsin-chu; Chun-Ching Tsan, Touliu; Wen-Kung Cheng, Toufen; Ying-Lang Wang, Tai-chung, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/541,485

(22) Filed: Apr. 3, 2000

(51) Int. Cl.[7] .................................................... H01L 21/31
(52) U.S. Cl. ..................... 438/788; 438/787; 438/197; 438/585
(58) Field of Search ................................ 438/788, 787, 438/786, 585, 592, 197; 427/579

(56) References Cited

U.S. PATENT DOCUMENTS

| | | | |
|---|---|---|---|
| 4,394,401 | * | 7/1983 | Shioya et al. . |
| 4,681,653 | * | 7/1987 | Purdes et al. . |
| 5,418,019 | | 5/1995 | Chen et al. ................. 427/579 |
| 5,429,988 | * | 7/1995 | Huang et al. . |
| 5,567,643 | * | 10/1996 | Lee et al. . |
| 5,600,165 | | 2/1997 | Tsukamoto et al. ............... 257/323 |
| 5,804,088 | | 9/1998 | McKee ............................ 216/47 |
| 5,811,870 | * | 9/1998 | Bhattacharyya et al. . |
| 5,879,966 | * | 3/1999 | Lee et al. . |
| 6,004,853 | * | 12/1999 | Yang et al. . |
| 6,171,973 | * | 1/2001 | Schiavone et al. . |
| 6,235,653 | * | 5/2001 | Chien et al. . |
| 6,281,146 | * | 8/2001 | Wang et al. . |

* cited by examiner

Primary Examiner—Charles Bowers
Assistant Examiner—Stephen W. Smoot
(74) Attorney, Agent, or Firm—George O. Saile; Stephen B. Ackerman; Stephen G. Stanton (57) ABSTRACT

A method for forming a patterned reflective layer first employs a substrate. There is then formed over the substrate a blanket reflective layer. There is then formed upon the blanket reflective layer an anti-reflective coating (ARC) layer formed employing a plasma enhanced chemical vapor deposition (PECVD) method employing a deposition gas composition comprising silane, nitrous oxide and argon. There is then formed upon the blanket anti-reflective coating (ARC) layer a blanket photoresist layer. There is then photoexposed and developed the blanket photoresist layer to form a patterned photoresist layer. There is then etched, while employing a first etch method, the blanket anti-reflective coating (ARC) layer to form a patterned anti-reflective coating (ARC) layer while employing the patterned photoresist layer as a first etch mask layer. Finally, there is then etched, while employing a second etch method, the blanket reflective layer to form the patterned reflective layer while employing at least the patterned anti-reflective coating (ARC) layer as a second etch mask layer.

10 Claims, 3 Drawing Sheets

METHOD FOR FORMING ANTI-REFLECTIVE COATING LAYER WITH ENHANCED FILM THICKNESS UNIFORMITY

BACKGROUND OF THE INVENTION

1. Field of the Invention

The present invention relates generally to methods for forming patterned layers within microelectronic fabrications. More particularly, the present invention relates to methods for forming anti-reflective coating (ARC) layers which are employed for forming patterned reflective layers within microelectronic fabrications.

2. Description of the Related Art

Microelectronic fabrications are formed from microelectronic substrates over which are formed patterned microelectronic conductor layers which are separated by microelectronic dielectric layers.

As microelectronic fabrication integration levels have increased and microelectronic device and patterned microelectronic conductor layer dimensions have decreased, it has become increasingly important within microelectronic fabrications to form microelectronic device and patterned microelectronic conductor layers with enhanced linewidth control. Such enhanced linewidth control of microelectronic device and patterned microelectronic conductor layers when formed employing reflective microelectronic materials within microelectronic fabrications is typically effected by employing interposed between: (1) a reflective blanket microelectronic layer desired to be patterned to form a microelectronic device or patterned microelectronic conductor layer; and (2) a blanket photoresist layer from which is formed a patterned photoresist layer which in turn is employed in forming the microelectronic device or patterned microelectronic conductor layer from the reflective blanket microelectronic layer, a blanket anti-reflective coating (ARC) layer. Such blanket anti-reflective coating (ARC) layers are employed to attenuate standing wave photoexposure reflections which would otherwise provide for inhomogeneous photoexposure of the blanket photoresist layer.

While blanket anti-reflective coating (ARC) layers are thus desirable within the art of microelectronic fabrication for purposes of assisting in forming from blanket microelectronic layers formed of reflective materials microelectronic device and patterned microelectronic conductor layers with enhanced linewidth control, blanket anti-reflective coating (ARC) layers themselves are not formed entirely without problems within the art of microelectronic fabrication. In that regard, it is often important that blanket anti-reflective coating (ARC) layers be formed within microelectronic fabrications in a fashion such that they uniformly attenuate standing wave photoexposures of blanket photoresist layers formed upon those blanket anti-reflective coating (ARC) layers and thus in turn provide more uniform linewidth patterned photoresist layers which ultimately provide enhanced linewidth control of microelectronic devices and patterned microelectronic conductor layers formed employing those blanket anti-reflective coating (ARC) layers. Such a result often requires that a blanket anti-reflective coating (ARC) layer be formed with enhanced film thickness uniformity.

It is thus towards the goal that the present invention is directed.

Various methods and resulting microelectronic fabrication structures have been disclosed within the art of microelectronic fabrication for forming anti-reflective coating (ARC) layers with desirable properties within microelectronic fabrications.

For example, Chen et al., in U.S. Pat. No. 5,418,019, discloses a plasma enhanced chemical vapor deposition (PECVD) method for forming an anti-reflective coating (ARC) layer for use upon a silicon substrate layer within a microelectronic fabrication, where the anti-reflective coating (ARC) layer has: (1) enhanced anti-reflective properties in comparison with a single layer silicon nitride anti-reflective coating (ARC) layer formed employing a plasma enhanced chemical vapor deposition (PECVD) method; and (2) enhanced manufacturability in comparison with a bilayer magnesium difluoride/zinc sulfide anti reflective coating (ARC) layer formed employing a thermal evaporation method. The plasma enhanced chemical vapor deposition (PECVD) method employs forming upon the silicon substrate layer a silicon nitride layer having a refractive index of about 2.3, and then forming upon the silicon nitride layer a silicon oxide layer.

In addition, Tsukamoto et al., in U.S. Pat. No. 5,600,165, discloses a field effect transistor (FET) semiconductor integrated circuit microelectronic fabrication device whose gate electrode patterning is effected employing a silicon oxynitride anti-reflective coating (ARC) layer while simultaneously attenuating degradation of electrical properties of the field effect transistor (FET) semiconductor integrated circuit microelectronic device incident to hydrogen diffusion from the silicon oxynitride anti-reflective coating (ARC) layer into a gate dielectric layer of the field effect transistor (FET) semiconductor integrated circuit microelectronic fabrication device. The field effect transistor (FET) semiconductor integrated circuit microelectronic device is fabricated while effecting the foregoing result by employing interposed between the silicon oxynitride anti-reflective coating (ARC) layer and the gate dielectric layer a hydrogen permeation barrier layer.

Finally, McKee, in U.S. Pat. No. 5,804,088 discloses a method for forming microelectronic devices and patterned microelectronic layers of linewidth narrower than a minimum linewidth of a patterned photoresist layer formed from a blanket photoresist layer photoexposed with i-line photoexposure radiation. The method employs an intermediate layer formed interposed between a blanket target layer to be patterned and a patterned photoresist layer employed in patterning the blanket target layer, where the intermediate layer may provide: (1) anti-reflective coating (ARC) properties when forming the patterned photoresist layer from a corresponding blanket photoresist layer while employing i-line photoexposure radiation; (2) etch stop properties when forming an isotropically etched patterned photoresist layer from the patterned photoresist layer; and (3) etch residue liftoff properties for removing from a patterned target layer derived from the blanket target layer etch residues after etching patterned target layer to a linewidth dimension defined by the isotropically etched patterned photoresist layer.

Desirable in the art of microelectronic fabrication are additional methods and materials for forming anti-reflective coating (ARC) layers with enhanced film thickness uniformity.

It is towards that goal that the present invention is directed.

SUMMARY OF THE INVENTION

A first object of the present invention is to provide a method for forming an anti-reflective coating (ARC) layer within a microelectronic fabrication.

A second object of the present invention is to provide a method in accord with the first object of the present invention, where the anti-reflective coating (ARC) layer is formed with enhanced film thickness uniformity.

A third object of the present invention is to provide a method in accord with the first object of the present invention and the second object of the present invention, which method is readily commercially implemented.

In accord with the objects of the present invention, there is provided by the present invention a method for forming a silicon containing dielectric layer within a microelectronic fabrication. To practice the method of the present invention, there is first provided a substrate. There is then formed over the substrate a silicon containing layer while employing a plasma enhanced chemical vapor deposition (CVD) method. The plasma enhanced chemical vapor deposition (PECVD) method employs a deposition gas composition comprising silane, nitrous oxide and argon, where by employing argon within the deposition gas composition there is provided the silicon containing dielectric layer with an enhanced film thickness uniformity. The silicon containing dielectric layer formed in accord with the present invention may be employed as an anti-reflective coating (ARC) layer.

There is provided by the present invention a method for forming an anti-reflective coating (ARC) layer within a microelectronic fabrication, where the anti-reflective coating (ARC) layer is formed with enhanced film thickness uniformity. The present invention realizes the foregoing object by employing when forming the anti-reflective coating (ARC) layer a silicon containing dielectric layer formed employing a plasma enhanced chemical vapor deposition (PECVD) method, where the plasma enhanced chemical vapor deposition (PECVD) method employs a deposition gas composition comprising silane, nitrous oxide and argon. While it is not clear within the present invention why a silicon containing dielectric layer formed employing a plasma enhanced chemical vapor deposition (PECVD) method employing a deposition gas composition comprising silane, nitrous oxide and argon is formed with enhanced film thickness uniformity, it is nonetheless clear that the silicon containing dielectric layer formed employing the plasma enhanced chemical vapor deposition (PECVD) method employing the deposition gas composition comprising silane, nitrous oxide and argon in accord with the present invention exhibits enhanced film thickness uniformity in comparison with an otherwise equivalent silicon containing dielectric layer formed employing a plasma enhanced chemical vapor deposition (PECVD) method employing a deposition gas composition comprising silane, nitrous oxide and helium.

The method of the present invention is readily commercially implemented. The method of the present invention employs methods and materials as are generally known in the art of microelectronic fabrication. Since it is a materials selection and process control which at least in part provides the present invention, rather than the existence of methods and materials which provides the present invention, the method of the present invention is readily commercially implemented.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying drawings, which form a material part of this disclosure, wherein.

DESCRIPTION OF THE PREFERRED EMBODIMENTS

There is provided by the present invention a method for forming an anti-reflective coating (ARC) layer within a microelectronic fabrication, where the anti-reflective coating (ARC) layer is formed with enhanced film thickness uniformity. The present invention realizes the foregoing object by employing when forming the anti-reflective coating (ARC) layer a silicon containing dielectric layer formed employing a plasma enhanced chemical vapor deposition (PECVD) method, where the plasma enhanced chemical vapor deposition (PECVD) method employs a deposition gas composition comprising silane, nitrous oxide and argon.

Although the preferred embodiments of the present invention illustrate the present invention within the context of forming within a microelectronic fabrication a silicon containing dielectric layer formed with enhanced film thickness uniformity, where the silicon containing dielectric layer is formed as an anti-reflective coating (ARC) layer, the method of the present invention may similarly be employed for forming silicon containing dielectric layers with enhanced film thickness uniformity, where the silicon containing dielectric layers need not necessarily be formed as anti-reflective coating (ARC) layers. Similarly, the present invention may be employed for forming silicon containing dielectric layers, whether or not as anti-reflective coating (ARC) layers, within microelectronic fabrications including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

First Preferred Embodiment

Figure 1:
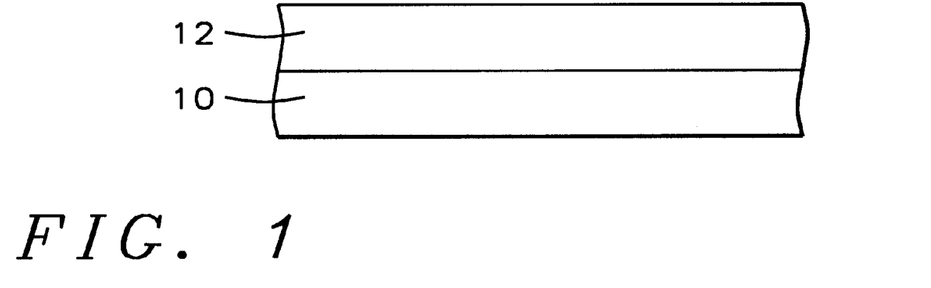
FIG. 1, FIG. 2, FIG. 3 and FIG. 4 show a series of schematic cross-sectional diagrams illustrating the results of forming, in accord with a general embodiment of the present invention which comprises a first preferred embodiment of the present invention, a patterned reflective layer within a microelectronic fabrication.

Referring now to FIG. 1 to FIG. 4 there is shown a series of schematic cross-sectional diagrams illustrating the results of forming, in accord with a general embodiment of the present invention which comprises a first preferred embodiment of the present invention, a patterned reflective layer within a microelectronic fabrication. Shown in FIG. 1 is a schematic cross-sectional diagram of the microelectronic fabrication at an early stage in its fabrication in accord with the first preferred embodiment of the present invention.

Shown in FIG. 1 is a substrate 10 having formed thereover a blanket reflective layer 12.

Within the first preferred embodiment of the present invention, the substrate 10 may be a substrate employed within a microelectronic fabrication selected from the group including but not limited to integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

Although not specifically illustrated within the schematic cross-sectional diagram of FIG. 1, the substrate 10 may be the substrate itself as employed within the microelectronic fabrication, or in the alternative, the substrate 10 may be the substrate as employed within the microelectronic fabrication, where the substrate has formed thereupon and/or thereover, and thus incorporated therein, any of several additional layers are conventionally employed within the microelectronic fabrication within which is employed the substrate 10. Such additional microelectronic layers, similarly with the substrate 10 itself, may be formed from microelectronic materials including but not limited to microelectronic conductor materials, microelectronic semiconductor materials and microelectronic dielectric materials.

Within the first preferred embodiment of the present invention with respect to the blanket reflective layer 12, the blanket reflective layer 12 may be formed of reflective materials as are similarly conventional in the art of microelectronic fabrication, including but not limited to reflective conductor materials, reflective semiconductor materials and reflective dielectric materials. Typically and preferably, the blanket reflective layer 12 is formed to a thickness of from about 15 to about 100000 angstroms upon the substrate 10.

Within the context of the present invention, it is intended that in order for the present invention to provide value in ultimately forming a patterned reflective layer with enhanced linewidth control from the blanket reflective layer 12, the blanket reflective layer 12 typically and preferably will have a reflectivity of greater than about 50 percent, more typically and preferably from about 80 to about 100 percent, at a wavelength of light employed in photoexposing a blanket photoresist layer when forming a patterned photoresist layer which is employed as a mask layer when forming the patterned reflective layer from the blanket reflective layer 12.

Figure 2:
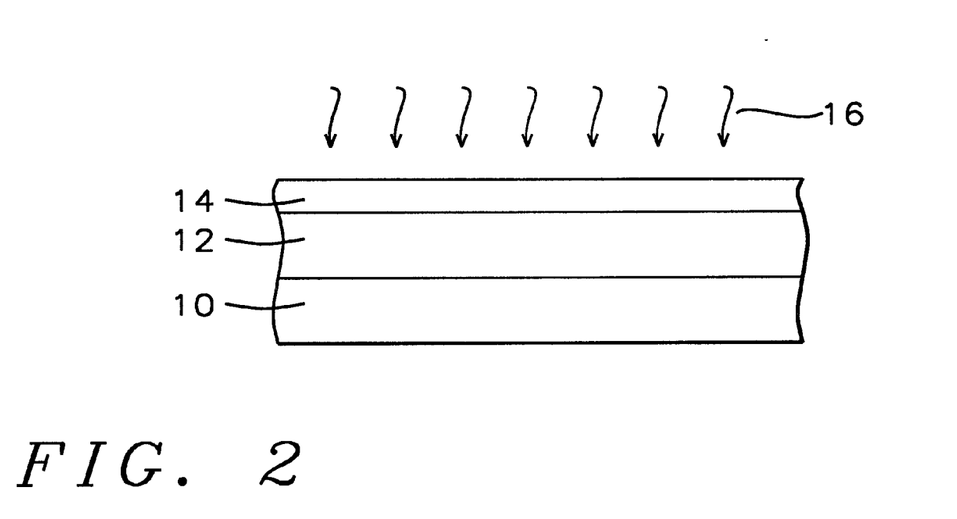

Referring now to FIG. 2, there is shown a schematic cross-sectional diagram illustrating the results of further processing of the microelectronic fabrication whose schematic cross-sectional diagram is illustrated in FIG. 1.

Shown in FIG. 2 is a schematic cross-sectional diagram of a microelectronic fabrication otherwise equivalent to the microelectronic fabrication whose schematic cross-sectional diagram is illustrated in FIG. 1, but wherein there is formed upon the blanket reflective layer 12 a blanket anti-reflective coating (ARC) layer 14. Within the method of the present invention, the blanket anti-reflective coating (ARC) layer 14 is formed of a silicon containing dielectric material formed employing a plasma enhanced chemical vapor deposition (PECVD) method employing a deposition gas composition comprising silane, nitrous oxide and argon.

Within the deposition gas composition employed within the method of the present invention, it is significant that there is employed argon as a diluent gas, since as will be shown within the examples which follow, when there is employed argon as a diluent gas rather than an other gas as a diluent gas, the blanket anti-reflective coating (ARC) layer 14 is formed with enhanced film thickness uniformity. Within the present invention, it is assumed that the silicon containing dielectric material which forms the blanket anti-reflective coating (ARC) layer 14 is most probably a silicon oxide dielectric material, although it is not precluded within the present invention that there may be incorporated within the silicon containing dielectric material other materials which result from plasma induced reaction of the deposition gas composition comprising silane, nitrous oxide and argon.

Preferably, the deposition plasma 16 as illustrated within the schematic cross-sectional diagram of FIG. 2 also employs, when processing an eight inch diameter substrate 10: (1) a reactor chamber pressure of from about 5 to about 6 torr; (2) a radio frequency source power of from about 800 to about 1200 watts at a source radio frequency of 13.56 MHZ; (3) a substrate 10 temperature of from about 380 to about 420 degrees centigrade; (4) a showerhead nozzle separation of from about the substrate 10 of from about 360 to about 440 mils; (5) a silane flow rate of from about 45 to about 55 standard cubic centimeters per minute (sccm); (6) a nitrous oxide flow rate of from about 34 to about 42 standard cubic centimeters per minute (sccm); and (7) an argon flow rate of from about 1700 to about 2100 standard cubic centimeters per minute (sccm).

Typically and preferably, the blanket anti-reflective coating (ARC) layer 14 as illustrated within FIG. 2 will be formed to a thickness of from about 250 to about 700 angstroms when employed as an anti-reflective coating (ARC) layer with respect to deep ultraviolet (DUV) (i.e. 248 nm) photoexposure radiation, which thickness will typically require a deposition time of from about 6 to about 14 seconds while employing the deposition plasma 16 within the context of the above delineated parameters and limits.

Figure 3:
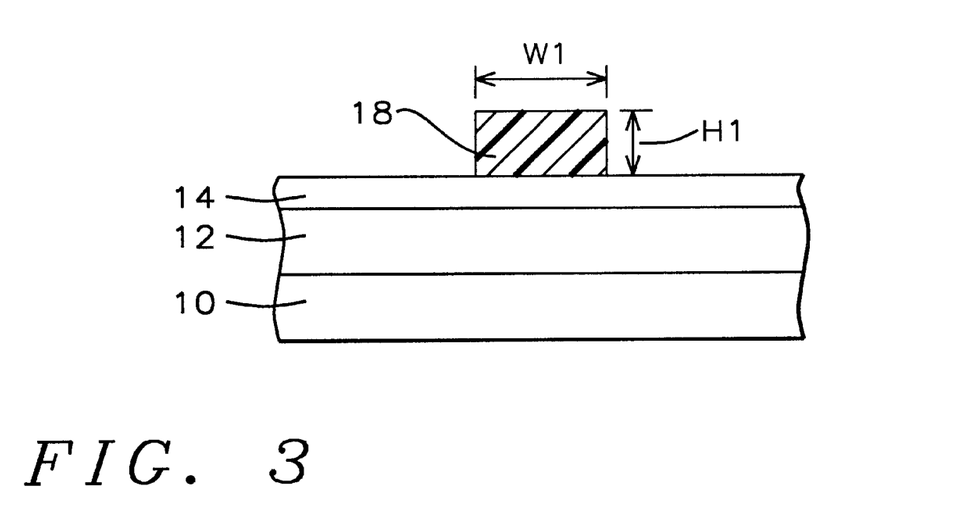

Referring now to FIG. 3, there is shown a schematic cross-sectional diagram illustrating the results of further processing of the microelectronic fabrication whose schematic cross-sectional diagram is illustrated in FIG. 2.

Shown in FIG. 3 is a schematic cross-sectional diagram of a microelectronic fabrication otherwise equivalent to the microelectronic fabrication whose schematic cross-sectional diagram is illustrated in FIG. 2, but wherein there is formed upon the blanket anti-reflective coating (ARC) layer 14 a patterned photoresist layer 18.

Within the first preferred embodiment of the present invention, the patterned photoresist layer 18 may be formed from any of several photoresist materials as are conventional in the art of microelectronic fabrication, including photoresist materials selected from the general groups of photoresist materials including but not limited to positive photoresist materials and negative photoresist materials. For the first preferred embodiment of the present invention, the patterned photoresist layer 18 is typically and preferably formed of a linewidth W1 of from about 0.23 to about 0.29 microns and a thickness H1 of from about 6000 to about 12000 angstroms, as illustrated within the schematic cross-sectional diagram of FIG. 3.

Although not specifically illustrated within the schematic cross-sectional diagram of FIG. 3, within the context of the present invention the patterned photoresist layer 18 is typically and preferably formed from a corresponding blanket photoresist layer with enhanced linewidth control, since the blanket anti-reflective coating (ARC) layer 14 is formed with enhanced film thickness uniformity.

Figure 4:
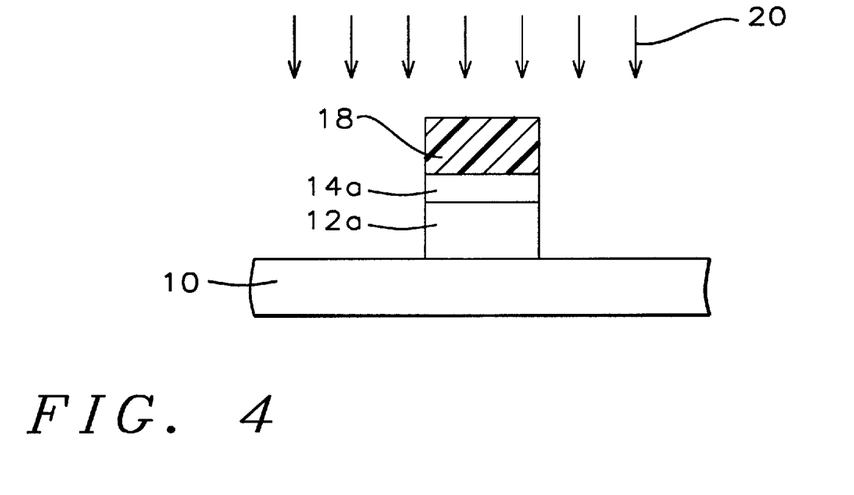

Referring now to FIG. 4, there is shown a schematic cross-sectional diagram illustrating the results of further processing of the microelectronic fabrication whose schematic cross-sectional diagram is illustrated in FIG. 3.

Shown in FIG. 4 is a schematic cross-sectional diagram of a microelectronic fabrication otherwise equivalent to the microelectronic fabrication whose schematic cross-sectional diagram is illustrated in FIG. 3, but wherein: (1) the blanket anti-reflective coating (ARC) layer 14 has been patterned to form a patterned anti-reflective coating (ARC) layer 14a;

and (2) the blanket reflective layer 12 has been patterned to form a patterned reflective layer 12a, through use of an etching plasma 20.

Within the first preferred embodiment of the present invention, the etching plasma 20 typically and preferably employs an etchant gas composition, or a series of etchant gas compositions, appropriate to the materials from which are formed the blanket anti-reflective coating (ARC) layer 14 and the blanket reflective layer 12. Typically and preferably, such etchant gas compositions will include a fluorine containing etchant gas composition for etching at least the blanket anti-reflective coating (ARC) layer 14, since within the present invention, and the first preferred embodiment of the present invention, the blanket anti-reflective coating (ARC) layer 14 is formed of a silicon containing dielectric material.

Upon forming the microelectronic fabrication whose schematic cross-sectional diagram is illustrated in FIG. 4, there is formed the microelectronic fabrication having formed therein the patterned reflective layer 12a with enhanced linewidth control since there is employed when forming the patterned photoresist layer 18 which is employed in defining the patterned reflective layer 12a the blanket anti-reflective coating (ARC) layer 14 within enhanced film thickness uniformity.

Second Preferred Embodiment

Figure 5:
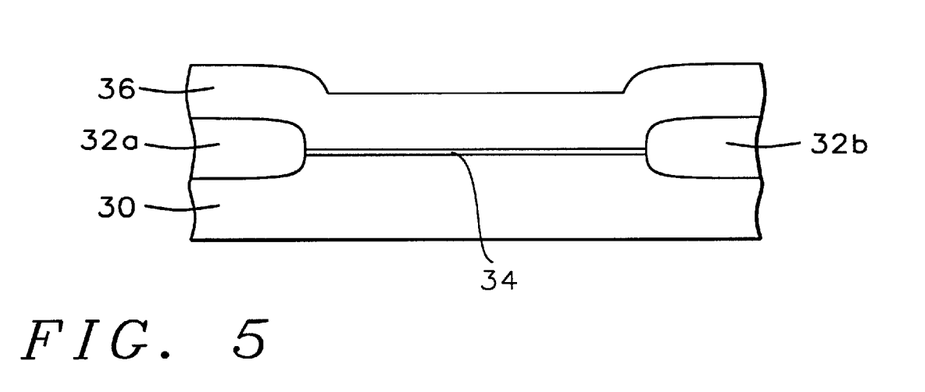
FIG. 5, FIG. 6, FIG. 7 and FIG. 8 show a series of schematic cross-sectional diagrams illustrating the results of forming, in accord with a more specific embodiment of the present invention which comprises a second preferred embodiment of the present invention, a gate electrode within a field effect transistor (FET) within a semiconductor integrated circuit microelectronic fabrication.

Referring now to FIG. 5 to FIG. 8, there is shown a series of schematic cross-sectional diagrams illustrating the results of forming in accord with a more specific embodiment of the present invention which comprises a second preferred embodiment of the present invention a gate electrode within a field effect transistor (FET) within a semiconductor integrated circuit microelectronic fabrication. Shown in FIG. 5 is a schematic cross-sectional diagram of the semiconductor integrated circuit microelectronic fabrication at an early stage in its fabrication in accord with the second preferred embodiment of the present invention.

Shown in FIG. 5 is a semiconductor substrate 30 having formed within and upon its surface a pair of isolation regions 32a and 32b which define an active region of the semiconductor substrate 30. Although it is known in the art of semiconductor integrated circuit microelectronic fabrication that semiconductor substrates are available with either dopant polarity, various dopant concentrations and several crystallographic orientations, for the second preferred embodiment of the present invention, the semiconductor substrate 30 is typically and preferably a (100) silicon semiconductor substrate having an N- or P-dopant concentration.

Similarly, although it is also known in the art of semiconductor integrated circuit microelectronic fabrication that isolation regions may be formed within and upon semiconductor substrates to define active regions of those semiconductor substrates while employing methods including but not limited to isolation region thermal growth methods and isolation region deposition/patterning methods, for the second preferred embodiment of the present invention, the isolation regions 32a and 32b are preferably formed within and upon the semiconductor substrate 30 to define the active region of the semiconductor substrate 30 while employing an isolation region thermal growth method at a temperature of from about 1000 to about 1100 degrees centigrade to form the isolation regions 32a and 32b of silicon oxide formed within and upon the semiconductor substrate 30.

Shown also within the schematic cross-sectional diagram of FIG. 5 is: (1) a blanket gate dielectric layer 34 formed upon the active region of the semiconductor substrate 30 and bounded by the isolation regions 32a and 32b; and (2) a blanket gate electrode material layer 36 formed upon the blanket gate dielectric layer 34 and the isolation regions 32a and 32b. Both the blanket gate dielectric layer 34 and the blanket gate electrode material layer 36 may be formed employing methods and materials as are conventional in the art of semiconductor integrated circuit microelectronic fabrication.

For example, although it is known in the art of semiconductor integrated circuit microelectronic fabrication that blanket gate dielectric layers may be formed employing methods including but not limited to blanket gate dielectric layer thermal growth methods and blanket gate dielectric layer deposition/patterning methods, for the second preferred embodiment of the present invention, the blanket gate dielectric layer 34 is preferably formed employing a blanket gate dielectric layer thermal growth method at a temperature of from about 750 to about 850 degrees centigrade to form the blanket gate dielectric layer 34 of silicon oxide of thickness from about 30 to about 80 angstroms upon the active region of the semiconductor substrate 30.

Similarly, although is also known in the art of semiconductor integrated circuit microelectronic fabrication that blanket gate electrode material layers may be formed of gate electrode materials including but not limited to metal, metal alloy, doped polysilicon (having a dopant concentration of greater than about 1E20 dopants per cubic centimeter), and polycide (doped polysilicon/metal silicide stack) gate electrode materials, for the second preferred embodiment of the present invention, the blanket gate electrode material layer 36 is preferably formed of a doped polysilicon or polycide gate electrode material formed to a thickness of from about 500 to about 1000 angstroms upon the blanket gate dielectric layer 34 and the isolation regions 32a and 32b.

Figure 6:
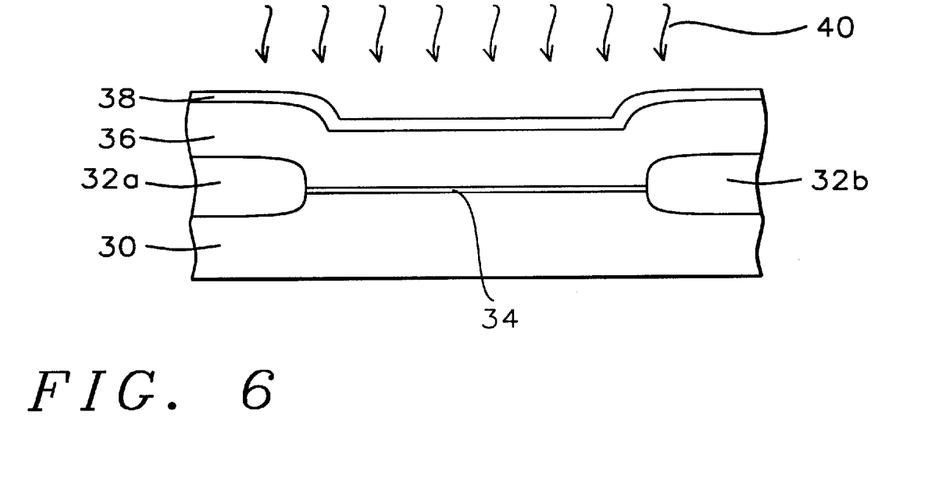

Referring now to FIG. 6, there is shown a schematic cross-sectional diagram illustrating the results of further processing of the semiconductor integrated circuit microelectronic fabrication whose schematic cross-sectional diagram is illustrated in FIG. 5.

Shown in FIG. 6 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 5, but wherein there is formed upon the blanket gate electrode material layer 36 a blanket anti-reflective coating (ARC) layer 38 through use of a deposition plasma 40. Within the second preferred embodiment of the present invention, the blanket anti-reflective coating (ARC) layer 38 and the deposition plasma 40 are preferably formed employing methods, materials and limitations analogous or equivalent to the methods, materials and limitations employed in forming the corresponding blanket anti-reflective coating (ARC) layer 14 and deposition plasma 16 as employed within the first preferred embodiment of the present invention and as illustrated within the schematic cross-sectional diagram of FIG. 2.

Figure 7:
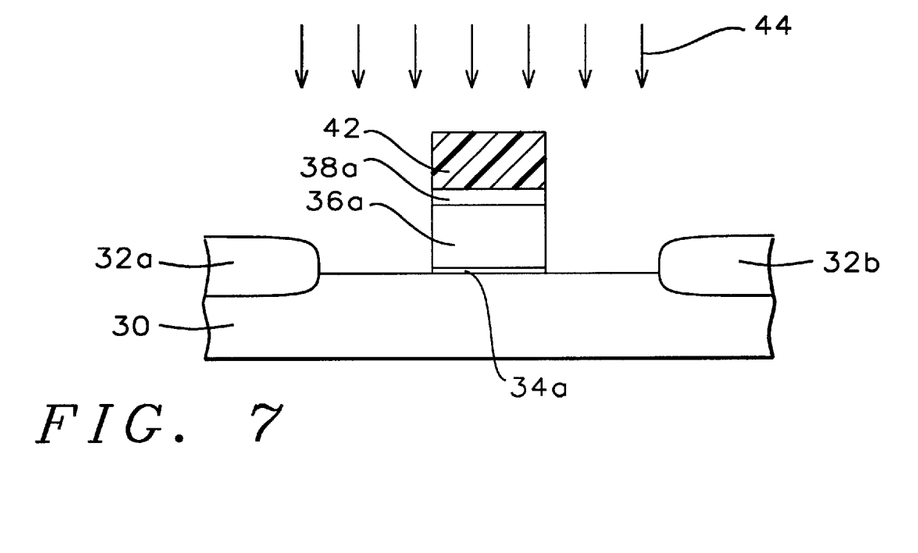

Referring now to FIG. 7, there is show a schematic cross-sectional diagram illustrating the results of further processing of the semiconductor integrated circuit microelectronic fabrication whose schematic cross-sectional diagram is illustrated in FIG. 6.

Shown in FIG. 7 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 6, but wherein, in a first instance, there is formed upon the blanket anti-reflective coating (ARC) layer 38 a patterned photoresist layer 42, and then, in a second instance, the patterned photoresist layer 42 is employed as an etch mask layer for forming from the blanket anti-reflective coating (ARC) layer 38, the blanket gate electrode material layer 36 and the blanket gate dielectric layer 34 a corresponding patterned anti-reflective coating (ARC) layer 38a, a corresponding gate electrode 36a and a corresponding patterned gate dielectric layer 34a, while employing an etching plasma 44. The etching plasma 44 as employed within the second preferred embodiment of the present invention as illustrated within FIG. 7 is analogous or equivalent to the etching plasma 20 as illustrated within the first preferred embodiment of the present invention within the schematic cross-sectional diagram of FIG. 4, with the additional proviso that the etching plasma 44 will typically and preferably employ a fluorine containing etching gas composition when etching either of the blanket anti-reflective coating (ARC) layer 38 or the blanket gate dielectric layer 34, while similarly employing a chlorine containing etchant gas composition when etching the blanket gate electrode material layer 36.

Figure 8:
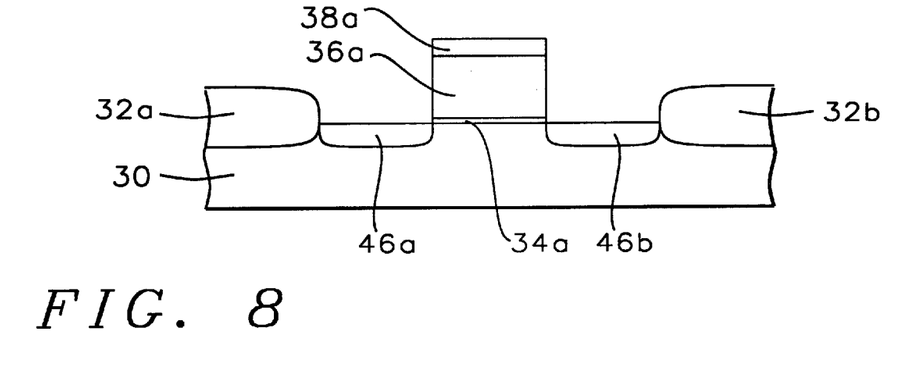

Referring now to FIG. 8, there is shown a schematic cross-sectional diagram illustrating the results of further processing of the semiconductor integrated circuit microelectronics fabrication whose schematic cross-sectional diagram is illustrated in FIG. 7.

Shown in FIG. 8 is a schematic cross-sectional diagram of a semiconductor integrated circuit microelectronic fabrication otherwise equivalent to the semiconductor integrated circuit microelectronic fabrication whose schematic cross-sectional diagram is illustrated in FIG. 7, but wherein, in a first instance, there has been stripped from the patterned anti-reflective coating (ARC) layer 38a the patterned photoresist layer 42, and then, in a second instance, there is formed into the semiconductor substrate 30 at areas not covered by the patterned gate dielectric layer 34a, the gate electrode 36a and the patterned anti-reflective coating (ARC) layer 38a a pair of source/drain regions 46a and 46b.

Within the second preferred embodiment of the present invention the patterned photoresist layer 42 may be stripped from the semiconductor integrated circuit microelectronic fabrication whose schematic cross-sectional diagram is illustrated in FIG. 7 to provide in part the semiconductor integrated circuit microelectronic fabrication whose schematic cross-sectional diagram is illustrated in FIG. 8 while employing photoresist stripping methods and materials as are conventional in the art of semiconductor integrated circuit microelectronic fabrication. Such photoresist stripping methods and materials may include, but are not limited to wet chemical stripping methods and dry plasma stripping methods.

Although the schematic cross-sectional diagrams of FIG. 7 and FIG. 8 illustrate stripping of the patterned photoresist layer 42 after both the patterned anti-reflective coating (ARC) layer 38a and the gate electrode 36a have been formed employing the etching plasma 44, it is understood by a person skilled in the art that the patterned photoresist layer 42 may also be stripped intervening forming the patterned anti-reflective coating (ARC) layer 38a and the gate electrode 36a, such that the patterned anti-reflective coating (ARC) layer 38a is employed as a hard mask layer for forming the gate electrode 36a.

Similarly, with respect to the source/drain regions 46a and 46b, the source/drain regions 46a and 46b may be formed within the active regions of the semiconductor substrate 30 as illustrated within the schematic cross-sectional diagram of FIG. 8 at areas not covered by the patterned gate dielectric layer 34a, the gate electrode 36a and the patterned anti-reflective coating (ARC) layer 38a while employing an ion implant method employing an ion implantation dose of from about 1E14 to about 1E16 dopant ions per square centimeter and an ion implantation energy of from about 30 to about 60 keV.

Upon forming the semiconductor integrated circuit microelectronic fabrication whose schematic cross-sectional diagram is illustrated in FIG. 8, there is formed a semiconductor integrated circuit microelectronic fabrication having formed therein a field effect transistor (FET) having formed therein a gate electrode with enhanced linewidth control. The gate electrode has the enhanced linewidth control since there is employed when forming a patterned photoresist layer which is employed in defining the gate electrode a blanket anti-reflective coating (ARC) layer with enhanced film thickness uniformity.

As is understood by a person skilled in the art, although the second preferred embodiment of the present invention illustrates the present invention within the context of forming within a semiconductor integrated circuit microelectronic fabrication a field effect transistor (FET) having a gate electrode with enhanced linewidth control, the second preferred embodiment of the present invention may also be employed in forming within semiconductor integrated circuit microelectronic fabrications other structures with enhanced linewidth control. Such other structures may include, but are not limited to, patterned conductor layer structures.

EXAMPLES

There was obtained two series of five eight inch diameter (100) silicon semiconductor substrates (i.e. a total of ten eight inch diameter (100) silicon semiconductor substrates divided into two groups of five) and formed upon each semiconductor substrate within the two series of five eight inch diameter (100) silicon semiconductor substrates a blanket silicon oxide layer of thickness about 50 angstroms. The blanket silicon oxide layers were formed employing a thermal oxidation method at a temperature of about 1000 degrees centigrade.

Upon each blanket silicon oxide layer formed upon each semiconductor substrate was then formed a blanket polysilicon layer of thickness about 500 angstroms. The blanket polysilicon layers were formed employing a low pressure thermal chemical vapor deposition (LPCVD) method employing silane as a silicon source material, as is conventional in the art of semiconductor integrated circuit microelectronic fabrication.

Upon the blanket polysilicon layers formed upon a first series of the two series of five semiconductor substrates was then formed a series of five anti-reflective coating (ARC) layers formed employing a first plasma enhanced chemical vapor deposition (PECVD) method employing a first deposition gas composition comprising silane, nitrous oxide and helium. The first plasma enhanced chemical vapor deposition (PECVD) method also employed: (1) a reactor chamber pressure of about 5 torr; (2) a radio frequency power of about 1200 watts at a radio frequency of 13.56 MHZ; (3) a semiconductor substrate temperature of about 400 degrees centigrade; (4) a showerhead nozzle spacing from the semiconductor substrate of about 400 mils; (5) a silane flow rate of about 55 standard cubic centimeters per minute (sccm);

(6) a nitrous oxide flow rate of about 95 standard cubic centimeters per minute (sccm); and (7) a helium flow rate of about 1200 standard cubic centimeters per minute (sccm). Each one of the five blanket anti-reflective coating (ARC) layers was formed over one of the five semiconductor substrates at one of five nominal thicknesses, including 250 angstroms, 265 angstroms, 280 angstroms, 295 angstroms and 310 angstroms.

Upon the blanket polysilicon layers formed over a second series of the two series of semiconductor substrates was formed a second series of anti-reflective coating (ARC) layers formed employing a second plasma enhanced chemical vapor deposition (PECVD) method employing a second deposition gas composition comprising silane, nitrous oxide and argon. The second plasma enhanced chemical vapor deposition (PECVD) method also employed: (1) a reactor chamber pressure of about 5 torr; (2) a radio frequency source power of about 1000 watts at a source radio frequency of 13.56 MHZ; (3) a semiconductor substrate temperature of about 400 degrees centigrade; (4) a showerhead nozzle separation from the semiconductor substrate of about 400 mils; (5) a silane flow rate of about 50 standard cubic centimeters per minute (sccm); (6) a nitrous oxide flow rate of about 40 standard cubic centimeters per minute (sccm); and (7) an argon flow rate of about 1000 standard cubic centimeters per minute (sccm). Similarly with the anti-reflective coating (ARC) layers formed employing the first plasma enhanced chemical vapor deposition (PECVD) method, the anti-reflective coating (ARC) layers formed employing the second plasma enhanced chemical vapor deposition (PECVD) method were each formed over one of the five semiconductor substrates within the second series of semiconductor substrates at one of five nominal thicknesses, including 250 angstroms, 265 angstroms, 280 angstroms, 295 angstroms and 310 angstroms.

The film thickness uniformities of the first series of anti-reflective coating (ARC) layers and the second series of anti-reflective coating (ARC) layers were then determined employing measurement and inspection methods as are conventional in the art of semiconductor integrated circuit microelectronic fabrication. In that regard, film thickness measurements are generally understood as representative of an extent of a variation of a film thickness across a single semiconductor substrate in comparison with an average film thickness of the film formed across the semiconductor substrate. The results of the film thickness uniformity measurements are reported in Table I

TABLE I

| Dep. Gas Composition | Film Thickness Uniformity (%) |
| --- | --- |
| SiH4/N2O/He | 2.5 |
| SiH4/N2O/Ar | 1.0 |

As is seen from review of the data within Table I, the film thickness uniformity of the anti-reflective coating layers formed employing the deposition gas composition comprising silane, nitrous oxide and argon is enhanced in comparison with the film thickness uniformity of the anti-reflective coating (ARC) layers formed employing the deposition gas composition comprising silane, nitrous oxide and helium.

There was then formed upon each of the two series of anti-reflective coating (ARC) layers formed upon each of the two series of polysilicon layers formed upon each of the two series of semiconductor substrates a patterned photoresist layer defining a series of patterned photoresist lines of linewidth about 0.3 microns separated by a pitch separation dimension of about 0.3 microns.

The blanket anti-reflective coating (ARC) layers and the blanket polysilicon layers formed upon each of the semiconductor substrates were then sequentially etched while employing a first plasma etch method employing a first etchant gas composition comprising a carbon tetrafluoride etchant gas, followed by a second plasma etch method employing a second etchant gas composition comprising a chlorine etchant gas composition. Both the first plasma etch method and the second plasma etch method also employed: (1) a reactor chamber pressure of about 1.0 mtorr; (2) a radio frequency source power of about 300 watts at a source radio frequency of 13.56 MHZ; (3) a semiconductor substrate temperature of about 70 degrees centigrade; (4) a plasma gap of about 5 cm. The first plasma etch method also employed a carbon teterafluoride flow rate of about 100 standard cubic centimeters per minute. The second plasma etch method also employed a chlorine flow rate of about 200 standard cubic centimeters per minute (sccm). The blanket anti-reflective coating (ARC) layers and the blanket polysilicon layers were patterned until there was reached the blanket silicon oxide layers which served as a series of etch stop layers.

There was then stripped from each of the patterned anti-reflective coating (ARC) layers and corresponding underlying patterned polysilicon layers the series of patterned photoresist layers employing an oxygen plasma ashing method as is conventional in the art of semiconductor integrated circuit microelectronic fabrication.

Finally, there was then measured the linewidth of the patterned anti-reflective coating (ARC) layers and co-extensive patterned polysilicon layers while employing measurement and inspection techniques as are conventional in the art of semiconductor integrated circuit microelectronic fabrication. The resulting linewidth measurements are reported in Table II.

TABLE II

| ARC Layer Thickness | Polysilicon Layer Linewidth (microns) | |
| --- | --- | --- |
| (angstroms) | SiH4/N2O/He ARC | SiH4/N2O/Ar ARC |
| 250 | 0.274 +/− 0.020 | 0.291 +/− 0.017 |
| 265 | 0.281 +/− 0.020 | 0.300 +/− 0.019 |
| 280 | 0.294 +/− 0.018 | 0.299 +/− 0.014 |
| 295 | 0.297 +/− 0.023 | 0.310 +/− 0.018 |
| 310 | 0.302 +/− 0.015 | 0.317 +/− 0.012 |

As seen from review of the data within Table II, for corresponding nominal thickness of the series of anti-reflective coating (ARC) layers formed employing the first plasma enhanced chemical vapor deposition (PECVD) method employing the first deposition gas composition comprising silane, nitrous oxide and helium in comparison with the second plasma enhanced chemical vapor deposition (PECVD) method employing the second deposition gas composition comprising silane, nitrous oxide and argon, there is observed when employing the deposition gas compositions comprising silane, nitrous oxide and argon more uniform linewidth dimensions of patterned polysilicon layers and thus enhanced linewidth control of the patterned polysilicon layers.

As is understood by a person skilled in the art, the preferred embodiments and examples of the present invention are illustrative of the present invention rather than limiting of the present invention. Revisions and modifications may be made to methods, materials, structures and dimensions through which is provided an anti-reflective coating (ARC) layer in accord with the preferred embodiments and examples of the present invention while still providing an anti-reflective coating (ARC) layer in accord with the spirit and scope of the present invention, as defined by the appended claims.

What is claimed is:

1. A method for forming a patterned reflective layer comprising:

providing a substrate;

forming over the substrate a blanket reflective layer;

forming upon the blanket reflective layer an anti-reflective coating (ARC) layer formed employing a plasma enhanced chemical vapor deposition (PECVD) method employing a deposition gas composition comprising silane, nitrous oxide and argon;

forming upon the blanket anti-reflective coating (ARC) layer a blanket photoresist layer;

photoexposing and developing the blanket photoresist layer to form a patterned photoresist layer;

etching, while employing a first etch method, the blanket anti-reflective coating (ARC) layer to form a patterned anti-reflective coating (ARC) layer while employing the patterned photoresist layer as a first etch mask layer;

etching, while employing a second etch method, the blanket reflective layer to form the patterned reflective layer while employing at least the patterned anti-reflective coating (ARC) layer as a second etch mask layer.

2. The method of claim 1 wherein the substrate is employed within a microelectronic fabrication selected from the group consisting of integrated circuit microelectronic fabrications, ceramic substrate microelectronic fabrications, solar cell optoelectronic microelectronic fabrications, sensor image array optoelectronic microelectronic fabrications and display image array optoelectronic microelectronic fabrications.

3. The method of claim 1 wherein the blanket reflective layer is formed from a reflective material selected from the group consisting of reflective conductor materials, reflective semiconductor materials and reflective dielectric materials.

4. The method of claim 1 wherein the blanket reflective layer is a blanket gate electrode material layer employed for forming a gate electrode within a field effect transistor (FET).

5. The method of claim 1 wherein the blanket anti-reflective coating (ARC) layer is formed with an enhanced film thickness uniformity and the patterned reflective layer is formed with an enhanced linewidth uniformity.

6. The method of claim 5 wherein the enhanced film thickness uniformity is effected in comparison with a deposition gas composition comprising silane, nitrous oxide and helium.

7. A method for forming a gate electrode within a field effect transistor comprising:

providing a semiconductor substrate;

forming over the semiconductor substrate a blanket gate electrode material layer;

forming upon the blanket gate electrode material layer an anti-reflective coating (ARC) layer formed employing a plasma enhanced chemical vapor deposition (PECVD) method employing a deposition gas composition comprising silane, nitrous oxide and argon;

forming upon the blanket anti-reflective coating (ARC) layer a blanket photoresist layer;

photoexposing and developing the blanket photoresist layer to form a patterned photoresist layer;

etching, while employing a first etch method, the blanket anti-reflective coating (ARC) layer to form a patterned anti-reflective coating (ARC) layer while employing the patterned photoresist layer as a first etch mask layer;

etching, while employing a second etch method, the blanket gate electrode material layer to form a gate electrode while employing at least the patterned anti-reflective coating (ARC) layer as a second etch mask layer.

8. The method of claim 7 wherein the blanket gate electrode material layer is formed from a gate electrode material selected from the group consisting of doped polysilicon and polycide gate electrode materials.

9. The method of claim 7 wherein the blanket anti-reflective (ARC) layer is formed with an enhanced film thickness uniformity and the gate electrode is formed with an enhanced linewidth uniformity.

10. The method of claim 9 wherein the enhanced film thickness uniformity is effected in comparison with a deposition gas composition comprising silane, nitrous oxide and helium.

* * * * *